United States Patent
Wu et al.

(10) Patent No.: US 8,977,942 B2
(45) Date of Patent: Mar. 10, 2015

(54) DATA ERROR-DETECTION SYSTEM AND DATA ERROR-DETECTION METHOD THEREOF

(71) Applicant: National Tsing Hua University, Hsinchu (TW)

(72) Inventors: Shu-Yu Wu, Taichung (TW); Cheng-Wen Wu, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 104 days.

(21) Appl. No.: 13/837,859

(22) Filed: Mar. 15, 2013

(65) Prior Publication Data

US 2014/0157076 A1     Jun. 5, 2014

(30) Foreign Application Priority Data

Dec. 3, 2012  (TW) .............................. 101145243 A

(51) Int. Cl.
| | | |
|---|---|---|
| H03M 13/00 | (2006.01) | |
| H03M 13/11 | (2006.01) | |
| H03M 13/29 | (2006.01) | |
| H03M 13/09 | (2006.01) | |

(52) U.S. Cl.
CPC ...... *H03M 13/2918* (2013.01); *H03M 13/2927* (2013.01); *H03M 13/098* (2013.01)
USPC ........... 714/800; 714/746; 714/752; 714/755; 714/757; 714/804

(58) Field of Classification Search
None
See application file for complete search history.

(56) References Cited

U.S. PATENT DOCUMENTS

| | | | | |
|---|---|---|---|---|
| 7,206,987 | B2 * | 4/2007 | Roth et al. | 714/755 |
| 7,398,459 | B2 * | 7/2008 | Park et al. | 714/800 |
| 7,415,651 | B2 * | 8/2008 | Argon | 714/755 |
| 2003/0093740 | A1 * | 5/2003 | Stojanovic | 714/752 |
| 2004/0153961 | A1 * | 8/2004 | Park et al. | 714/800 |
| 2004/0221220 | A1 * | 11/2004 | Roth et al. | 714/758 |

* cited by examiner

*Primary Examiner* — Justin R Knapp
(74) *Attorney, Agent, or Firm* — Muncy, Geissler, Olds & Lowe, P.C.

(57) ABSTRACT

The present invention discloses a data error-detection system and the method thereof. The system includes an initializing module, an encoding module, a decoding module and a restoring module. The initializing module arranges the transmitting data in a 3D matrix to produce information data. The encoding module encodes the information data to produce checking data, and outputs encoding data which includes information data and checking data. The decoding module receives encoding data and detects information data according to the checking data to correct the information data and then produces 3D matrix receiving data. The restoring module produces receiving data according to the 3D matrix receiving data. Herewith, the effect of error-detection and correction of the data can be achieved.

4 Claims, 6 Drawing Sheets

DATA ERROR-DETECTION SYSTEM AND DATA ERROR-DETECTION METHOD THEREOF

CROSS-REFERENCE TO RELATED APPLICATION

This application claims the benefit of Taiwan Patent Application No. 101145243, filed on Dec. 3, 2012, in the Taiwan Intellectual Property Office, the disclosure of which is incorporated herein in its entirety by reference.

BACKGROUND OF THE INVENTION

1. Field of the Invention

The present invention generally relates to a data error-detection system and the method thereof, in particular to a data error-detection system and the method thereof which transforms the transmitting data to a 3D matrix in order to detect and correct the errors in the receiving end in real time.

2. Description of the Related Art

With the evolution of technology, the amount of data transmitted by electronic devices is growing, and with the increase in the amount of transmitted data, the probability of occurring errors is growing. Therefore, how to use the appropriate data error-detection methods to improve the reliability of the transmitted data has become an important issue.

Most of well known manners of data error-detection are by way of using error correction code to improve the reliability of the transmitted data, wherein the 2D product code is a commonly used error correction code, which transforms bits of data to a 2D matrix and detects and corrects the error of the transmitted data in a plane of the 2D matrix. However, the 2D product code is merely able to correct an error bit in a plane of the 2D matrix, and when transmitting large amount of data which contains two error bits, the 2D product code is unable to correct the data. Hence, the electronic devices are greatly hampered by the reliability of transmitting data, which is a serious problem.

As set forth above, the inventor of the present invention designs a data error-detection system and the method thereof to improve the deficiency of the existing manners for promoting the utilization of the industry.

SUMMARY OF THE INVENTION

Therefore, it is a primary objective of the present invention to provide a data error-detection system and the method thereof to overcome the deficiency of the existing method which is merely able to correct an error bit through a plane.

To achieve the foregoing objective, the present invention provides a data error-detection system comprising an initializing module, an encoding module, a decoding module and a restoring module. The initializing module arranges transmitting data in a 3D matrix to produce information data. The encoding module encodes the information data to produce checking data, and outputs encoding data, wherein the encoding data includes the information data and the checking data. The decoding module receives the encoding data, detects the information data according to the checking data to selectively correct the information data and then produces 3D matrix receiving data. The restoring module produces receiving data according to the 3D matrix receiving data.

In a preferred embodiment of the present invention, the decoding module may produce respectively a first decoding value, a second decoding value and a third decoding value corresponding to each bit in the information data according to first plane data, second plane data and third plane data of the encoding data corresponding to each bit, detect the information data according to the first decoding value, the second decoding value and the third decoding value to selectively correct the information data and then produce the 3D matrix receiving data.

In a preferred embodiment of the present invention, the checking data may include first checking data, second checking data and third checking data; and for each bit of the information data, the decoding module produces a first row parity value and a first column parity value according to the information data, the first checking data and the second checking data, and produces the first decoding value according to the information data, the first row parity value and the first column parity value; the decoding module produces a second row parity value and a second column parity value according to the information data, the first checking data and the third checking data, and produces the second decoding value according to the information data, the second row parity value and the second column parity value; and the decoding module produces a third row parity value and a third column parity value according to the information data, the second checking data and the third checking data, and produces the third decoding value according to the information data, the third row parity value and the third column parity value.

In a preferred embodiment of the present invention, the decoding module may produce a first flag value, a second flag value and a third flag value according to the encoding data; the decoding module may produce a first differing value according to the information data, the first row parity value and the first column parity value; the decoding module may produce a second differing value according to the information data, the second row parity value and the second column parity value; the decoding module may produce a third differing value according to the information data, the third row parity value and the third column parity value; and the decoding module may detect the information data according to the first flag value, the second flag value, the third flag value, the first differing value, the second differing value, the third differing value, the first decoding value, the second decoding value and the third decoding value to selectively correct the information data and then produce the 3D matrix receiving data.

In a preferred embodiment of the present invention, if the decoding module is unable to correct the information data according to the first flag value, the second flag value, the third flag value, the first differing value, the second differing value, the third differing value, the first decoding value, the second decoding value and the third decoding value, the decoding module may produce an error message.

To achieve the foregoing objective, the present invention further provides a data error-detection method applicable for a data error-detection system comprising an initializing module, an encoding module, a decoding module and a restoring module, comprising the following steps: arranging transmitting data in a 3D matrix to produce information data through the initializing module; encoding the information data to produce checking data, and outputting encoding data through the encoding module, wherein the encoding data includes the information data and the checking data; receiving the encoding data, detecting the information data according to the checking data to selectively correct the information data and then producing 3D matrix receiving data through the decoding module; and producing receiving data according to the 3D matrix receiving data through the restoring module.

As described above, the data error-detection system and the method thereof according to the present invention has the following advantages:

(1) The data error-detection system and the method thereof conquers the limitation of the existing method which can only correct an error bit in a 2D matrix, while the present invention is able to correct two error bits through three different planes corresponding to each bit in a 3D matrix.

(2) The data error-detection system and the method thereof sends an error message when the received data is unable to be corrected in order to ensure the correctness of the data.

BRIEF DESCRIPTION OF THE DRAWINGS

The detailed structure, operating principle and effects of the present invention will now be described in more details hereinafter with reference to the accompanying drawings that show the embodiment of the invention as follows.

DETAILED DESCRIPTION OF THE PREFERRED EMBODIMENTS

The technical content of the present invention will become apparent by the detailed description of the following embodiments and the illustration of related drawings as follows.

In difference with the 2D product code which transforms the data to a 2D matrix, the present invention transforms the data to a 3D matrix. There are three different cross sections corresponding to each bit in the 3D matrix and each cross section can be seen as a 2D matrix. Hence, through the interactively detecting and matching by the three different 2D matrixes, even if there are two error bits in a plane of the 3D matrix in the process of transmitting data, the two error bits can be detected and corrected by the other two planes.

Figure 1:
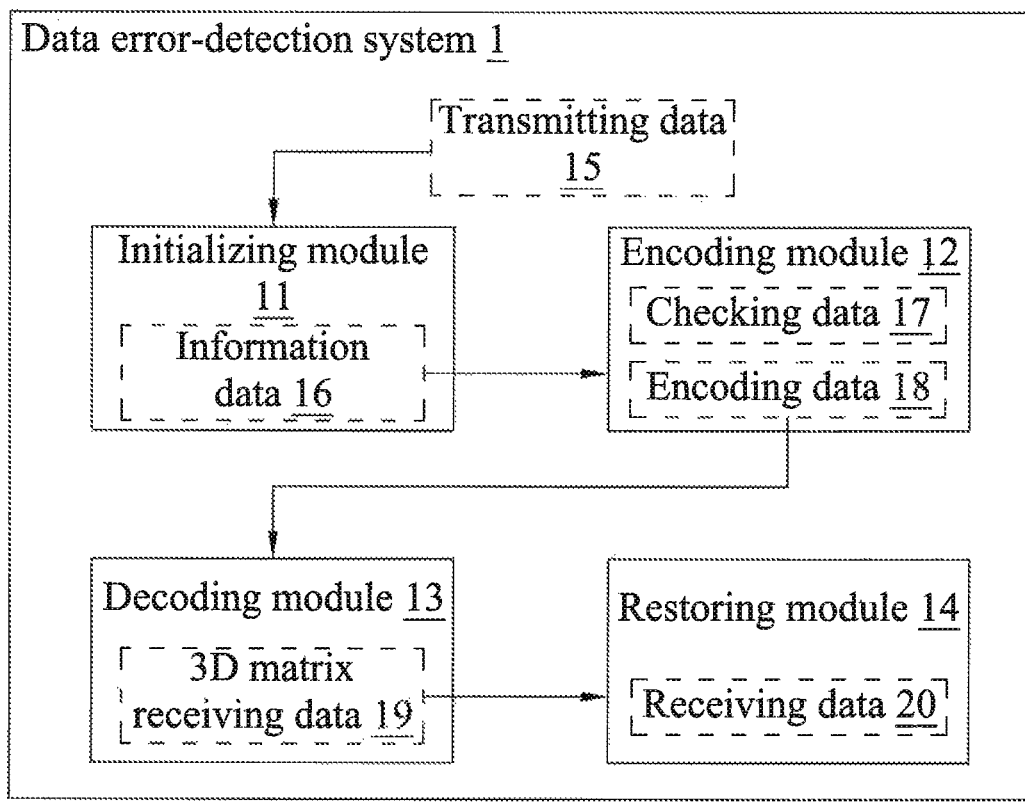
FIG. 1 is a block diagram of a data error-detection system of the present invention.

With reference to FIG. 1 for a block diagram of a data error-detection system in accordance with the present invention, the data error-detection system 1 includes an initializing module 11, an encoding module 12, a decoding module 13 and a restoring module 14. The initializing module 11 transforms transmitting data 15 to information data 16 which is in the form of the 3D matrix. For example, the initializing module 11 can fold and arrange the 1D data to the form of the 3D matrix. Sequentially, the encoding module 12 encodes the information data 16 to produce checking data 17 and then outputs encoding data 18 which comprises the information data 16 and the checking data 17. The encoding data 18 would be transmitted to the decoding module 13, and the decoding module 13 produces 3D matrix receiving data 19 according to the encoding data 18. The restoring module 14 transforms the 3D matrix receiving data 19 which is in the form of the 3D matrix to receiving data 20 which can be received by the receiving end.

Figure 2:
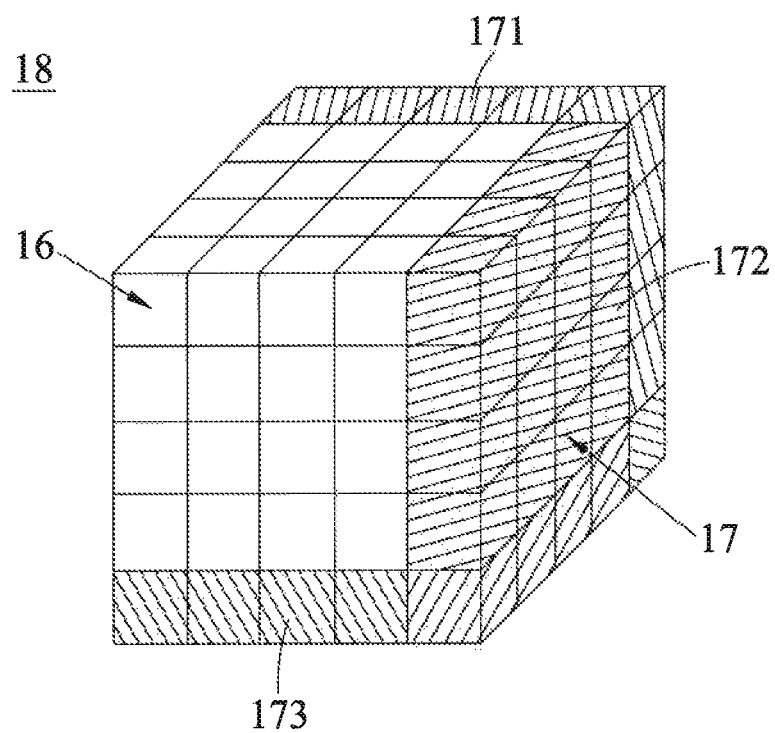
FIG. 2 is a first schematic diagram of a data error-detection system of the present invention.

Refers to FIG. 2 for the first schematic diagram of a data error-detection system of the present invention. For the convenience of explanation, the length of x-axis, y-axis and z-axis of the information data 16 are assumed to be q, l and m respectively. Therefore, the information data 16 have q*l*m bits and the encoding data 18 have (q+1)*(l+1)*(m+1) bits, wherein the checking data 17 include first checking data 171, second checking data 172 and third checking data 173 which have l*m, q*m and q*l bits respectively. Each bit in the 3D matrix formed by the encoding data 18 is indicated as b(i, j, k), wherein b(i, j, k) is 0 or 1. In the present embodiment, q, l and m are 4 but not limited.

In FIG. 2, the non-shadowed part is the information data 16, and the shadowed part is the checking data 17 including first checking data 171, second checking data 172 and third checking data 173. The value of each bit in the first checking data 171, the second checking data 172 and the third checking data 173 is determined through the encoding module 12 according to each bit in the information data 16 which is in the same axis with the bit, that is, the sum of bits in the information data 16 which are in the same axis with the bit. If the sum is even, the corresponding bits in the first checking data 171, the second checking data 172 and the third checking data 173 are 0. On the contrary, if the sum is odd, the corresponding bits in the first checking data 171, the second checking data 172 and the third checking data 173 are 1. For example, the encoding module 12 determines the value of b(1, 4, 0) according to that the sum of b(1, 0, 0), b(1, 1, 0), b(1, 2, 0) and b(1, 3, 0) is even or odd. If b(1, 0, 0), b(1, 1, 0), b(1, 2, 0) and b(1, 3, 0) are 1, 0, 1 and 0 respectively, the sum is 3 that is odd, and the encoding module 12 determines the value of b(1, 4, 0) is 1. The encoding module 12 determines the value of b(4, 2, 1) according to that the sum of b(0, 2, 1), b(1, 2, 1), b(2, 2, 1) and b(3, 2, 1) is even or odd. If b(0, 2, 1), b(1, 2, 1), b(2, 2, 1) and b(3, 2, 1) are 1, 1, 0 and 0 respectively, the sum is 2 that is even, and the encoding module 12 determines the value of b(4, 2, 1) is 0.

In addition, bits in the checking data 17 between the first checking data 171 and the second checking data 172 are determined according to the sum of bits in the information data 16 which are in the same plane with the bits. Bits in the checking data 17 between the first checking data 171 and the third checking data 173 and bits in the checking data 17 between the second checking data 172 and the third checking data 173 are determined similarly.

When the encoding module 12 determines all bits in the checking data 17, the encoding data 18 formed of the information data 16 and the checking data 17 would be transmitted to the decoding module 13.

Figure 3:
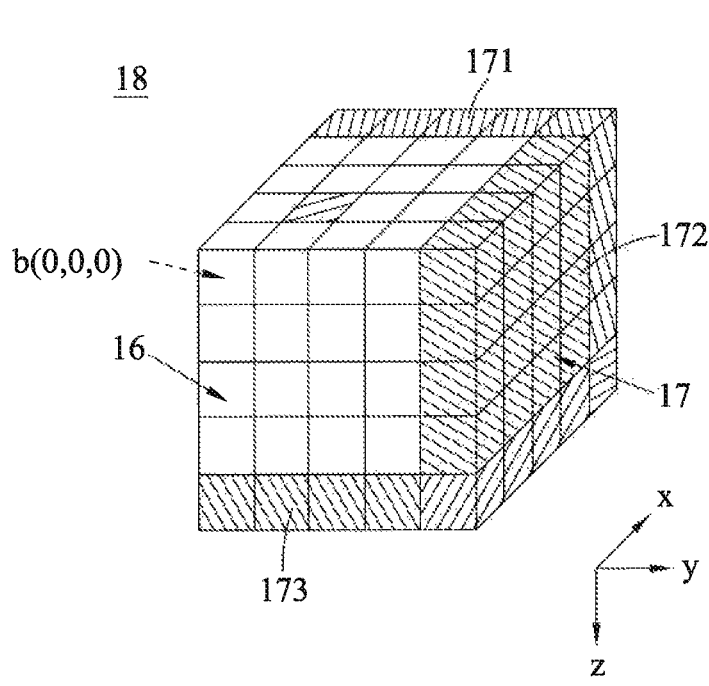
FIG. 3 is a second schematic diagram of a data error-detection system of the present invention.

Refers to FIG. 3 for the second schematic diagram of a data error-detection system of the present invention. For the convenience of explanation, the matrix of the encoding data 18 is in perspective of cross-sections of the xy-plane, the xz-plane and the yz-plane. The xy-plane exhibits the information 16, the first checking data 171 and the second checking data 172; the xz-plane exhibits the information 16, the first checking data 171 and the third checking data 173; and the yz-plane exhibits the information 16, the second checking data 172 and the third checking data 173. For each bit of the information data 16 in the xy-plane, the decoding module 13 determines correspondingly a first row parity value and a first column parity value according to the information data 16, the first checking data 171 and the second checking data 172 in the same plane; for each bit of the information data 16 in the xz-plane, the decoding module 13 determines correspondingly a second row parity value and a second column parity value according to the information data 16, the first checking data 171 and the third checking data 173 in the same plane; and for each bit of the information data 16 in the yz-plane, the decoding module 13 determines correspondingly a third row parity value and a third column parity value according to the information data 16, the second checking data 172 and the third checking data 173 in the same plane. In summary, in each plane, the first, second and third column parity value of the bit is determined as 1 or 0 according to that the sum of the bit itself and the information data 16 and the checking data 17 in the column where the bit is placed is odd or even; and in each plane, the first, second and third row parity value of the bit is determined as 1 or 0 according to that the sum of the bit itself and the information data 16 and the checking data 17 in the row where the bit is placed is odd or even. For example, if the values of the information data 16 and the checking data 17 exhibit as that in FIG. 3, in order to determine the first column parity value corresponding to b(1, 1, 0), the decoding module 13 calculates the sum of b(1, 0, 0)+b(1, 1, 0)+b(1, 2, 0)+b(1, 3, 0)+b(1, 4, 0)+b(1, 1, 0), which is 0+1+0+0+1+1, obtains 3 that is odd, and then determines the first column parity value corresponding to b(1, 1, 0) is 1. In order to determine the first row parity value corresponding to b(1, 1, 0), the decoding module 13 calculates the sum of b(0, 1, 0)+b(1, 1, 0)+b(1, 1, 0)+b(3, 1, 0)+b(4, 1, 0)+b(1, 1, 0), which is 0+1+0+0+1+1, obtains 3 that is odd, and then determines the row column parity value corresponding to b(1, 1, 0) is 1. The decoding module 13 determines the second column parity value, the second row parity value, the third column parity value and the third row parity value corresponding to b(1, 1, 0) similarly and the description would not repeat for concision.

Sequentially, the decoding module 13 produces a first flag value corresponding to each bit in the information data 16 according to the sum of all bits in the xy-plane where the bit is placed, produces a second flag value corresponding to each bit in the information data 16 according to the sum of all bits in the xz-plane where the bit is placed, and produces a third flag value corresponding to each bit in the information data 16 according to the sum of all bits in the yz-plane where the bit is placed. For example, the sum of all bits in the xy-plane where b(1, 1, 0) is placed is 4 that is even, the decoding module 13 determines the first flag value corresponding to b(1, 1, 0) is 0. The second flag value and the third flag vale corresponding to b(1, 1, 0) are determined as 0 similarly.

In addition, the decoding module 13 determines a first differing value corresponding to each bit in the information data 16 according to the first column parity value and the first row column parity value corresponding to the bit, determines a second differing value corresponding to each bit in the information data 16 according to the second column parity value and the second row column parity value corresponding to the bit, and determines a third differing value corresponding to each bit in the information data 16 according to the third column parity value and the third row column parity value corresponding to the bit. Simply speaking, if the bit itself, the first column parity bit and the first row parity bit corresponding to the hit are equal, the first differing value corresponding to the bit is 0, otherwise is 1. Similarly, if the bit itself, the second column parity bit and the second row parity bit corresponding to the bit are equal, the second differing value corresponding to the bit is 0, otherwise is 1; and if the bit itself, the third column parity bit and the third row parity bit corresponding to the bit are equal, the third differing value corresponding to the bit is 0, otherwise is 1.

Further, the decoding module 13 produces a first decoding value corresponding to each bit in the information data 16 according to the first column parity value and the first row parity value corresponding to the bit; produces a second decoding value corresponding to each bit in the information data 16 according to the second column parity value and the second row parity value corresponding to the bit; and produces a third decoding value corresponding to each bit in the information data 16 according to the third column parity value and the third row parity value corresponding to the bit.

Simply speaking, the decoding module 13 produces a first decoding value corresponding to the bit in the way of the majority according to the bit itself, the first column parity value and the first row parity value corresponding to the bit. For example, if the bit is 1, the first column parity value corresponding to the bit is 1 and the first row parity value corresponding to the bit is 0, the first decoding value corresponding to the bit is determined as 1. The first decoding value and the third decoding value corresponding to the bit are determined similarly and the description would not repeat.

After determining the first decoding value, the second decoding value and the third decoding value corresponding to the bit, the decoding module 13 determines that the first decoding value is valid or invalid according to the first flag value and the first differing value, the second decoding value is valid or invalid according to the second flag value and the second differing value, and the third decoding value is valid or invalid according to the third flag value and the third differing value. That is, in the condition that the first differing value is 1 and the first flag value is 0, the decoding module 13 determines the first decoding value as invalid, and in other conditions the decoding module 13 determines the first decoding value as valid. The decoding module 13 determines the second decoding value and the third decoding value as valid or invalid similarly. The decoding module 13 determines the value of the bit in the 3D matrix receiving data 19 according to the valid first decoding value, the valid second decoding value and the valid third decoding value corresponding to the bit by the way of consistency. For example, if the first decoding value is invalid, and the second decoding value and the third decoding value are valid and both are 1, the bit in the 3D matrix receiving data 19 is 1.

When the decoding module 13 determines the value of the bits in the information data 16 by the manner described above, the decoding module 13 composes the values of the bits to obtain the 3D matrix receiving data 19. Then, the restoring module 14 re-arranges the 3D matrix receiving data 19, for example, transforms the 3D matrix receiving data 19 to bits in the form of 1D array, in order to obtain the receiving data 20 which can be received by the receiving end.

The following would illustrate the embodiment that the decoding module 13 detects and corrects the encoding data 18 transmitted to the decoding module 13 when there are error bits in the encoding data 18. When there is only an error bit in the encoding data 18 in the process of transmitting, any of the three planes (xy-plane, xz-plane and yz-plane) could correct the error bit by the manner of the 2D product code, which is the ordinary skill in the art and the description would be omitted herein. The following would illustrate the condition that there are two or more error bits.

Figure 4:
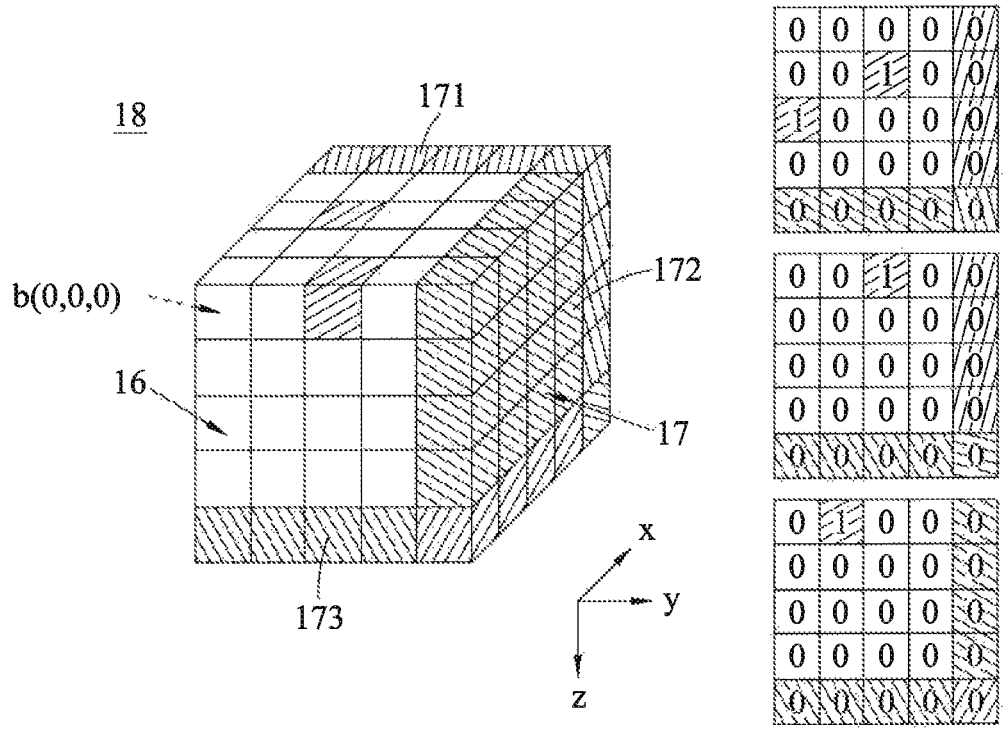
FIG. 4 is a third schematic diagram of a data error-detection system of the present invention.

With reference to FIG. 4 for the third schematic diagram of a data error-detection system of the present invention, the encoding data 18 are transmitted to the decoding module 13 and assumes that there are two error bits b(2, 1, 0) and b(0, 2, 0) in the information data 16 in the transmitting process. Take b(2, 1, 0) as an example, b(2, 1, 0) is originally 0, and becomes 1 after the error occurs.

The decoding module 13 determines the first column parity value corresponding to b(2, 1, 0) as 0 and the first row parity value corresponding to b(2, 1, 0) as 0 and then determines the first decoding value corresponding to b(2, 1, 0) as 0 in the way of the majority according to b(2, 1, 0), the first column parity value and the first row parity value. Since b(2, 1, 0), the first column parity value and the first row parity value are not equal, the first differing value corresponding to b(2, 1, 0) is determined as 1. Since the sum of the bits in the xy-plane corresponding to b(2, 1, 0) is 2, the decoding module 13 determines the first flag value as 0; and since the first differing value is 1 and the first flag value is 0, the decoding module 13 determines the first decoding value as invalid. The decoding module 13 determines similarly the second column parity value corresponding to b(2, 1, 0) as 0 and the second row parity value corresponding to b(2, 1, 0) as 0 and then determines the second decoding value corresponding to b(2, 1, 0) as 0 in the way of the majority according to b(2, 1, 0), the second column parity value and the second row parity value. Since b(2, 1, 0), the second column parity value and the second row parity value are not equal, the second differing value corresponding to b(2, 1, 0) is determined as 1. Since the sum of the bits in the xz-plane corresponding to b(2, 1, 0) is 1, the decoding module 13 determines the second flag value as 1; and since it is not the condition that the first differing value is 1 and the first flag value is 0, the decoding module 13 determines the second decoding value as valid and as 0. The decoding module 13 determines similarly the third decoding value as valid and as 0. Then, since the first decoding value is invalid, b(2, 1, 0) is determined by the way of consistency according to the second decoding value and third decoding value. Since both the second decoding value and third decoding value are 0, b(2, 1, 0) is determined as 0. That is, b(2, 1, 0) is originally 0, becomes 1 when the error occurs, and then is corrected to 0.

Figure 5:
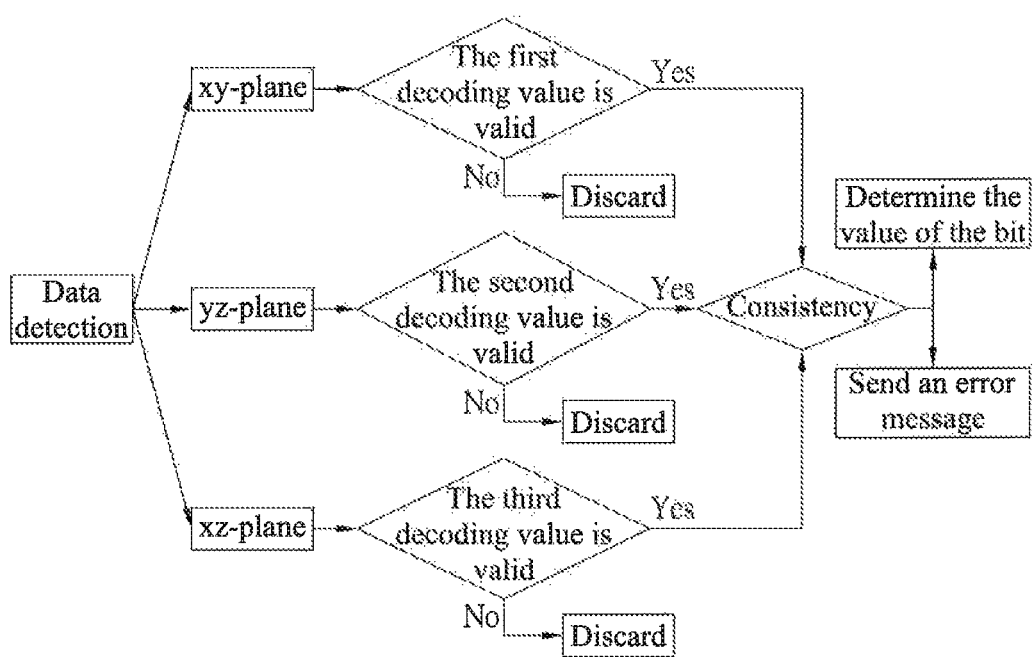
FIG. 5 is a fourth schematic diagram of a data error-detection system of the present invention.

Refers to FIG. 5 for the fourth schematic diagram of a data error-detection system of the present invention. As described above, the decoding module 13 detects whether there are two error bits in the planes corresponding to each bit in the encoding data 18; and if so, the decoding value corresponding to the plane would be determined as invalid to avoid that the invalid decoding value affects the detection and correction of the transmitted data.

It is worth mentioning that if the value of the bit is unable to be determined due to the inconsistency of the decoding values, the decoding module 13 produces an error message to notify the receiving end. For example, if the first decoding value corresponding to the bit is valid and is 1, the second decoding value corresponding to the bit is valid and is 0 and the third decoding value corresponding to the bit is invalid, the bit is unable to be determined due to the inconsistency of the decoding values and then the decoding module 13 produces an error message. In another case, if the first decoding value, the second decoding value and the third decoding value are all invalid, the decoding module 13 also produces an error message.

Incidentally, if there are less than 3 error bits in the encoding data 18 in the transmitting process, the condition that the bit is unable to be determined due to the inconsistency of the decoding values would not occurs.

For the clarity, the following illustrates a flowchart although the conception of the data error-detection method is described in company with the illustration of the data error-detection system.

Figure 6:
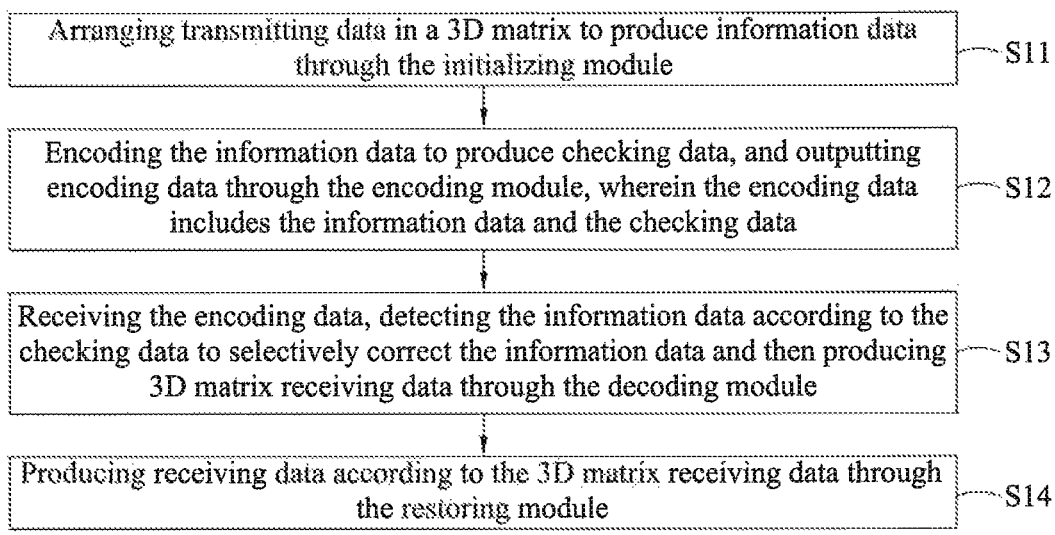
FIG. 6 is a flowchart of a data error-detection method of the present invention.

With reference to FIG. 6 for a flowchart of a data error-detection method in accordance with the present invention, the data error-detection method applicable for a data error-detection system comprising an initializing module, an encoding module, a decoding module and a restoring module, comprising the following steps:

step S11: arranging transmitting data in a 3D matrix to produce information data through the initializing module;

step S12: encoding the information data to produce checking data, and outputting encoding data through the encoding module, wherein the encoding data includes the information data and the checking data;

step S13: receiving the encoding data detecting the information data according to the checking data to selectively correct the information data and then producing 3D matrix receiving data through the decoding module; and step S14: producing receiving data according to the 3D matrix receiving data through the restoring module.

The detail illustration of the data error-detection method of the present invention has been described above in company with the description of the data error-detection system of the present invention and would not repeat for the concise.

While the means of specific embodiments in present invention has been described by reference drawings, numerous modifications and variations could be made thereto by those skilled in the art without departing from the scope and spirit of the invention set forth in the claims. The modifications and variations should in a range limited by the specification of the present invention.

Generally, embodiments of the present invention employ various processes involving data stored in or transferred through one or more computers or data processing devices. Embodiments of the present invention also relate to apparatus and systems for performing these operations. The apparatus may be specially constructed for the required purposes, or it may be a general-purpose computer selectively activated or reconfigured by a computer program and/or data structure stored in the computer. The processes presented herein are not inherently related to any particular computer or other apparatus. In particular, various general-purpose machines may be used with programs written in accordance with the teachings herein, or it may be more convenient to construct a more specialized apparatus to perform the required method steps. A particular structure for a variety of these machines will appear from the description given below.

In addition, embodiments of the present invention relate to computer program code, computer readable media or computer program products that include program instructions and/or data (including data structures) for performing various computer-implemented operations. Examples of computer-readable media include, but are not limited to, magnetic media such as hard disks, floppy disks, and magnetic tape; optical media such as CD-ROM disks; magneto-optical media; semiconductor memory devices, and hardware devices that are specially configured to store and perform program instructions, such as read-only memory devices (ROM) and random access memory (RAM). The data and program instructions of this invention may also be embodied on a carrier wave or other transport medium. Examples of program instructions include both machine code, such as produced by a compiler, and files containing higher level code that may be executed by the computer using an interpreter.

What is claimed is:

1. A computer-implemented data error-detection system, comprising:

an initializing module, arranged for arranging transmitting data in a three dimensional (3D) matrix to produce information data;

an encoding module, arranged for encoding the information data to produce checking data, and outputting encoding data encompassing the information data and the checking data;

a decoding module, arranged for receiving the encoding data, detecting the information data according to the checking data to selectively correct the information data and then producing 3D matrix receiving data; and a restoring module, arranged for producing receiving data according to the 3D matrix receiving data;

wherein the decoding module produces respectively a first decoding value, a second decoding value and a third decoding value corresponding to each bit in the information data according to first plane data, second plane data and third plane data of the encoding data corresponding to each bit, the decoding module further detects the information data according to the first decoding value, the second decoding value and the third decoding value to selectively correct the information data and then produces the 3D matrix receiving data;

wherein the checking data includes first checking data, second checking data and third checking data; and for each bit of the information data, the decoding module produces a first row parity value and a first column parity value according to the information data, the first checking data and the second checking data, and produces the first decoding value according to the information data, the first row parity value and the first column parity value; the decoding module produces a second row parity value and a second column parity value according to the information data, the first checking data and the third checking data, and produces the second decoding value according to the information data, the second row parity value and the second column parity value; and the decoding module produces a third row parity value and a third column parity value according to the information data, the second checking data and the third checking data, and produces the third decoding value according to the information data, the third row parity value and the third column parity value; and wherein the decoding module produces a first flag value, a second flag value and a third flag value according to the encoding data; the decoding module produces a first differing value according to the information data, the first row parity value and the first column parity value; the decoding module produces a second differing value according to the information data, the second row parity value and the second column parity value; the decoding module produces a third differing value according to the information data, the third row parity value and the third column parity value; and the decoding module detects the information data according to the first flag value, the second flag value, the third flag value, the first differing value, the second differing value, the third differing value, the first decoding value, the second decoding value and the third decoding value to selectively correct the information data and then produces the 3D matrix receiving data.

2. The computer-implemented data error-detection system of claim 1, wherein if the decoding module is unable to correct the information data according to the first flag value, the second flag value, the third flag value, the first differing value, the second differing value, the third differing value, the first decoding value, the second decoding value and the third decoding value, the decoding module produces an error message.

3. A computer-implemented data error-detection method, applicable for a data error-detection system comprising an initializing module, an encoding module, a decoding module and a restoring module, comprising the following steps:

arranging transmitting data in a three dimensional (3D) matrix to produce information data through the initializing module;

encoding the information data to produce checking data, and outputting encoding data through the encoding module, wherein the encoding data includes the information data and the checking data;

receiving the encoding data, detecting the information data according to the checking data to selectively correct the information data and then producing 3D matrix receiving data through the decoding module; and producing receiving data according to the 3D matrix receiving data through the restoring module;

wherein the method further comprises the following step:

producing respectively a first decoding value, a second decoding value and a third decoding value corresponding to each bit in the information data according to first plane data, second plane data and third plane data of the encoding data corresponding to each bit, detecting the information data according to the first decoding value, the second decoding value and the third decoding value to selectively correct the information data and then producing the 3D matrix receiving data through the decoding module;

wherein the checking data includes first checking data, second checking data and third checking data, the method further comprising following steps:

for each bit of the information data, producing a first row parity value and a first column parity value according to the information data, the first checking data and the second checking data, and producing the first decoding value according to the information data, the first row parity value and the first column parity value through the decoding module;

for each bit of the information data, producing a second row parity value and a second column parity value according to the information data, the first checking data and the third checking data, and producing the second decoding value according to the information data, the second row parity value and the second column parity value through the decoding module; and for each bit of the information data, producing a third row parity value and a third column parity value according to the information data, the second checking data and the third checking data, and producing the third decoding value according to the information data, the third row parity value and the third column parity value through the decoding module; and wherein the method further comprises the following step:

producing a first flag value, a second flag value and a third flag value according to the encoding data through the decoding module;

producing a first differing value according to the information data, the first row parity value and the first column parity value through the decoding module;

producing a second differing value according to the information data, the second row parity value and the second column parity value through the decoding module;

producing a third differing value according to the information data, the third row parity value and the third column parity value through the decoding module;

detecting the information data according to the first flag value, the second flag value, the third flag value, the first differing value, the second differing value, the third differing value, the first decoding value, the second decoding value and the third decoding value to selectively correct the information data and then producing the 3D matrix receiving data through the decoding module.

4. The computer-implemented data error-detection method of claim 3, further comprising the following step:
   if the decoding module is unable to correct the information data according to the first flag value, the second flag value, the third flag value, the first differing value, the second differing value, the third differing value, the first decoding value, the second decoding value and the third decoding value, producing an error message through the decoding module.

* * * * *